United States Patent
Moe et al.

(10) Patent No.: US 11,618,968 B2
(45) Date of Patent: Apr. 4, 2023

(54) APPARATUS INCLUDING HORIZONTAL FLOW REACTOR WITH A CENTRAL INJECTOR COLUMN HAVING SEPARATE CONDUITS FOR LOW-VAPOR PRESSURE METALORGANIC PRECURSORS AND OTHER PRECURSORS FOR FORMATION OF PIEZOELECTRIC LAYERS ON WAFERS

(71) Applicant: Akoustis, Inc., Huntersville, NC (US)

(72) Inventors: Craig Moe, Penfield, NY (US); Jeffrey M. Leathersich, Rochester, NY (US)

(73) Assignee: Akoustis, Inc., Huntersville, NC (US)

( * ) Notice: Subject to any disclaimer, the term of this patent is extended or adjusted under 35 U.S.C. 154(b) by 336 days.

(21) Appl. No.: 16/784,843

(22) Filed: Feb. 7, 2020

(65) Prior Publication Data

US 2021/0246570 A1    Aug. 12, 2021

(51) Int. Cl.
*C30B 35/00*    (2006.01)
*C30B 25/14*    (2006.01)
(Continued)

(52) U.S. Cl.
CPC .............. *C30B 25/14* (2013.01); *C23C 16/18* (2013.01); *C23C 16/4584* (2013.01);
(Continued)

(58) Field of Classification Search
CPC ......... C30B 25/00; C30B 25/02; C30B 25/08; C30B 25/10; C30B 25/12; C30B 25/14;
(Continued)

(56) References Cited

U.S. PATENT DOCUMENTS 5,231,327 A    7/1993 Ketcham
5,894,647 A    4/1999 Lakin
(Continued)

FOREIGN PATENT DOCUMENTS

JP    2009100197 A    5/2009
JP    2010068109 A    3/2010
(Continued)

OTHER PUBLICATIONS

International Search Report and Written Opinion, PCT/US2018/050521, dated Jan. 28, 2019.
(Continued)

*Primary Examiner* — Kenneth A Bratland, Jr.
(74) *Attorney, Agent, or Firm* — Stanek Lemon Crouse & Meeks, P.A.

(57) ABSTRACT

An apparatus for forming semiconductor films can include a horizontal flow reactor including an upper portion and a lower portion that are moveably coupled to one another so as to separate from one another in an open position and so as to mate together in a closed position to form a reactor chamber. A central injector column can penetrate through the upper portion of the horizontal flow reactor into the reactor chamber, the central injector column configured to allow metalorganic precursors into the reactor chamber in the closed position. A heated metalorganic precursor line can be coupled to the central injector column and configured to heat a low vapor pressure metalorganic precursor vapor contained in the heated metalorganic precursor line upstream of the central injector column to a temperature range between about 70 degrees Centigrade and 200 degrees Centigrade and a processor circuit can be operatively coupled to the heated metalorganic precursor line and configured to maintain a temperature of the low vapor pressure metalorganic precursor vapor within the temperature range.

16 Claims, 8 Drawing Sheets

(51) Int. Cl.
  *C30B 25/16* (2006.01)
  *H01L 41/316* (2013.01)
  *C23C 16/52* (2006.01)
  *C23C 16/18* (2006.01)
  *C23C 16/458* (2006.01)

(52) U.S. Cl.
  CPC ............ *C23C 16/52* (2013.01); *C30B 25/165* (2013.01); *C30B 35/00* (2013.01); *H01L 41/316* (2013.01)

(58) Field of Classification Search
  CPC ....... C30B 25/16; C30B 25/165; C30B 35/00; C30B 35/002; C23C 16/18; C23C 16/455; C23C 16/45561; C23C 16/458; C23C 16/4584; C23C 16/52; H01L 41/316
  USPC ........ 117/84, 88, 98–99, 102, 104, 106–107, 117/200, 204; 118/715, 722, 724–726, 118/728–730
  See application file for complete search history.

(56) References Cited

U.S. PATENT DOCUMENTS

| | | | |
|---|---|---|---|
| 6,051,907 | A | 4/2000 | Ylilammi |
| 6,114,635 | A | 9/2000 | Lakin et al. |
| 6,262,637 | B1 | 7/2001 | Bradley et al. |
| 6,377,137 | B1 | 4/2002 | Ruby |
| 6,384,697 | B1 | 5/2002 | Ruby |
| 6,472,954 | B1 | 10/2002 | Ruby et al. |
| 6,572,706 | B1* | 6/2003 | Nguyen ............... C23C 16/448 118/724 |
| 6,617,060 | B2 | 9/2003 | Weeks, Jr. et al. |
| 6,812,619 | B1 | 11/2004 | Kaitila et al. |
| 6,841,922 | B2 | 1/2005 | Aigner et al. |
| 6,864,619 | B2 | 3/2005 | Aigner et al. |
| 6,879,224 | B2 | 4/2005 | Frank |
| 6,902,620 | B1 | 6/2005 | Omstead et al. |
| 6,909,340 | B2 | 6/2005 | Aigner et al. |
| 6,933,807 | B2 | 8/2005 | Marksteiner et al. |
| 7,112,860 | B2 | 9/2006 | Saxler |
| 7,250,360 | B2 | 7/2007 | Shealy et al. |
| 7,268,436 | B2 | 9/2007 | Aigner et al. |
| 7,365,619 | B2 | 4/2008 | Aigner et al. |
| 7,514,759 | B1 | 4/2009 | Mehta et al. |
| 7,875,910 | B2 | 1/2011 | Sheppard et al. |
| 7,982,363 | B2 | 7/2011 | Chitnis |
| 8,304,271 | B2 | 11/2012 | Huang et al. |
| 9,309,473 | B2 | 4/2016 | McAlister |
| 10,797,681 | B1 | 10/2020 | Hurwitz et al. |
| 2003/0039866 | A1 | 2/2003 | Mitamura |
| 2005/0011459 | A1* | 1/2005 | Liu ................. C30B 25/14 118/728 |
| 2005/0093397 | A1 | 5/2005 | Yamada et al. |
| 2005/0140246 | A1 | 6/2005 | Wang et al. |
| 2005/0255234 | A1 | 11/2005 | Kanda et al. |
| 2006/0214539 | A1 | 9/2006 | Sato |
| 2006/0249081 | A1 | 11/2006 | Schumacher et al. |
| 2007/0080611 | A1 | 4/2007 | Yamada |
| 2007/0117363 | A1 | 5/2007 | Sakamoto et al. |
| 2007/0234962 | A1* | 10/2007 | Suzuki ............... C23C 16/45565 118/726 |
| 2008/0182358 | A1 | 7/2008 | Cowdery-Corvan et al. |
| 2008/0284541 | A1 | 11/2008 | Chitnis |
| 2009/0033177 | A1 | 2/2009 | Itaya et al. |
| 2009/0102319 | A1 | 4/2009 | Nakatsuka |
| 2010/0148637 | A1 | 6/2010 | Satou |
| 2010/0301379 | A1 | 12/2010 | Yokoyama |
| 2011/0114968 | A1 | 5/2011 | Sheppard et al. |
| 2012/0287575 | A1 | 11/2012 | Nelson |
| 2012/0298207 | A1 | 11/2012 | Woelk et al. |
| 2013/0111719 | A1 | 5/2013 | Deguet |
| 2013/0140525 | A1 | 6/2013 | Chen et al. |
| 2013/0183444 | A1 | 7/2013 | Soininen et al. |
| 2013/0327266 | A1 | 12/2013 | Arena et al. |
| 2014/0030444 | A1 | 1/2014 | Swaminathan et al. |
| 2014/0246305 | A1 | 9/2014 | Larson, III |
| 2014/0318443 | A1 | 10/2014 | Fenwick et al. |
| 2015/0381144 | A1 | 12/2015 | Bradley |
| 2016/0028367 | A1 | 1/2016 | Shealy |
| 2016/0036580 | A1 | 2/2016 | Shealy |
| 2016/0064645 | A1 | 3/2016 | Teshigahara |
| 2016/0203972 | A1 | 7/2016 | Sundaram et al. |
| 2016/0208414 | A1* | 7/2016 | Odawara ............... C30B 25/186 |
| 2016/0218271 | A1 | 7/2016 | Sakuma et al. |
| 2016/0339702 | A1 | 11/2016 | Kobayashi et al. |
| 2017/0149405 | A1 | 5/2017 | Kishimoto |
| 2017/0288628 | A1 | 10/2017 | Grannen |
| 2017/0310299 | A1 | 10/2017 | Bower et al. |
| 2018/0069168 | A1 | 3/2018 | Ikeuchi et al. |
| 2018/0174826 | A1 | 6/2018 | Raaijmakers et al. |
| 2018/0323767 | A1 | 11/2018 | Then et al. |
| 2018/0342999 | A1 | 11/2018 | Gibb et al. |
| 2019/0036511 | A1 | 1/2019 | Choy et al. |
| 2019/0199316 | A1 | 6/2019 | Houlden et al. |
| 2019/0305039 | A1 | 10/2019 | Wang et al. |
| 2021/0066070 | A1 | 3/2021 | Leone et al. |

FOREIGN PATENT DOCUMENTS

| | | |
|---|---|---|
| WO | WO 2005034349 A1 | 4/2005 |
| WO | WO 2016122877 | 8/2016 |

OTHER PUBLICATIONS

International Search Repor and Written Opiniont, PCT/US2015/034560, dated Sep. 18, 2015.

Yokoyama et al; *Effect of Mg and Zr Co-Doping on Piezoelectric AlN Thin Films for bulk Acoustic Wave Resonaters*; IEEE Transactions on Ultrasonics, Ferroelectrics, and Frequency Control, vol. 61, No. 8; Aug. 2014; pp. 1322-1328.

Yokoyama et al; *Dopant Concentration Dependence of Electromechanical Coupling Coefficients of Co-doped AlN Thin Films for BAW Devices*; IEEE International Ultrasonics Symposium Proceedings; (2016); 4 pages.

Ligl, et al; *Metalorganic Chemical Vapor Phase Deposition of AlScN/GaN Heterostructures*; Journal of Applied Physics 127, 195704; May 18, 2020; pp. 1-12.

Leone et al. *Metal-Organic Chemical Vapor Deposition of Aluminum Scandium Nitride*; Physica Status Solidi (RRL)—Rapid Research Letters; vol. 14, Issue 1; Oct. 31, 2019; pp. 1-16.

Hardy et al; *Epitaxial ScAlN Grown by Molecular Beam Epitaxy on GaN and SiC Substrates*; Applied Physics Letter 110; 162104; (2017); 5 pages.

Hardy et al; *Epitaxial ScAlN Etch-Stop Layers Grown by Molecular Beam Epitaxy for Selective Etching of AlN and GaN*; IEEE Transactions on Semiconductor Manufacturing, vol. 30, No. 4; Nov. 2017; pp. 475-479.

International Search Report and Written Opinion, PCT/US2021/016527, dated Oct. 26, 2021.

Leone, et al; Metal-Organic Chemical Vapor Deposition of Aluminum Scandium Nitride; Physica Status Solidi (RRL) vol. 14, Issue 1; Oct. 31, 2019.

International Search Report and Written Opinion for PCT/US2020/45658, dated Nov. 6, 2020, 14 pages.

International Search Report and Written Opinion for PCT/US2021/27678, dated Jul. 21, 2021, 11 pages.

International Search Report and Written Opinion for PCT/US2021/21160, dated Jul. 21, 2021, 15 pages.

Hao et al., "Single Crystalline ScAlN Acoustic Wave Resonators with Large Figure of Merit (Q?kts)", (2019) International Microwave Symposium.

Wikipedia "Field-effect transistor" Dec. 24, 2019, https://en.wikipedia.org/w/index.php?title=Field-effect_transistor&oldid=932242122.

(56) References Cited

OTHER PUBLICATIONS

Wikipedia "High-electron mobility transistor" Jan. 2, 2019; https://en.wikipedia.org/w/index.php?title=High-electron-mobility_transistor&oldid-876524143.

* cited by examiner

APPARATUS INCLUDING HORIZONTAL FLOW REACTOR WITH A CENTRAL INJECTOR COLUMN HAVING SEPARATE CONDUITS FOR LOW-VAPOR PRESSURE METALORGANIC PRECURSORS AND OTHER PRECURSORS FOR FORMATION OF PIEZOELECTRIC LAYERS ON WAFERS

BACKGROUND

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Wireless data communications can utilize RF filters operating at frequencies around 5 GHz and higher. It is known to use Bulk acoustic Wave Resonators (BAWR) incorporating polycrystalline piezoelectric thin films for some applications. While some polycrystalline based piezoelectric thin film BAWRs may be adequate for filters operating at frequencies from about 1 to 3 GHz, applications at frequencies around 5 GHz and above may present obstacles due to the reduced crystallinity associated with such thin poly-based films.

SUMMARY

Embodiments according to the invention can provide an apparatus for forming single crystal piezoelectric layers using low-vapor pressure metalorganic precursors in CVD systems and methods of forming single crystal piezoelectric layers using the same. Pursuant to these embodiments, an apparatus for forming semiconductor films can include a horizontal flow reactor including an upper portion and a lower portion that are moveably coupled to one another so as to separate from one another in an open position and so as to mate together in a closed position to form a reactor chamber. A central injector column can penetrate through the upper portion of the horizontal flow reactor into the reactor chamber, the central injector column configured to allow metalorganic precursors into the reactor chamber in the closed position. A heated metalorganic precursor line can be coupled to the central injector column and configured to heat a low vapor pressure metalorganic precursor vapor contained in the heated metalorganic precursor line upstream of the central injector column to a temperature range between about 70 degrees Centigrade and 200 degrees Centigrade. A processor circuit can be operatively coupled to the heated metalorganic precursor line and configured to maintain a temperature of the low vapor pressure metalorganic precursor vapor within the temperature range.

DESCRIPTION OF EMBODIMENTS ACCORDING TO THE INVENTION

According to the present invention, techniques generally related to electronic devices are provided. More particularly, the present invention provides techniques related to a method of manufacture and structure for, for example, bulk acoustic wave resonator devices, single crystal resonator devices, single crystal filter and resonator devices, and the like. These types of devices have been applied to a single crystal resonator device for communication devices, mobile devices, and computing devices, among others.

Embodiments according to the invention can utilize low vapor pressure metalorganic (MO) precursors for the CVD formation of single crystal piezoelectric layers that incorporate dopants (such as Scandium Sc) and Yttrium Y) at relatively high concentrations by heating the low vapor pressure MO precursor to a relatively high temperature (such as greater than 150 degrees Centigrade). For example, in some embodiments according to the invention, a CVD system can heat a low vapor pressure MO precursor, such as, tris(cyclopentadienyl)Sc (i.e., (Cp)3Sc)) and (MeCp)3Sc or Cp3Y and (MeCp)3Y, to at least 150 degrees Centigrade. Other low vapor pressure MO precursors may also be used in embodiments according to the present invention.

In some embodiments, the source vessel that holds the source of the low vapor pressure metalorganic (MO) precursors can be heated to at least 150 degrees Centigrade as well as the lines that deliver the low vapor pressure MO precursor vapor to the CVD reactor chamber. In some embodiments, the CVD reactor is a horizontal flow reactor that can generate a laminar flow of the low vapor pressure MO precursor vapor over the wafers in the reactor. In some embodiments according to the invention, the horizontal flow reactor can include a planetary type apparatus that rotates during the deposition process and that rotates the wafer stations that hold each of the wafers. In some embodiments according to the invention, the low vapor pressure MO precursor can be any metal organic material having a vapor pressure of 4.0 Pa or less at room temperature. In some embodiments according to the invention, the low vapor pressure MO precursor can be any metal organic material having a vapor pressure of between about 4.0 Pa to about 0.004 Pa at room temperature.

In still further embodiments according to the invention, the heated line that conducts the low vapor pressure MO precursor vapor to the CVD reactor chamber is thermally isolated from the other MO precursors and hydrides. For example, in some embodiments, the heated line that conducts the low vapor pressure MO precursor vapor to the CVD reactor chamber is provided to the central injector column via a different route than that used to provide the other precursors, such as through a flexible heated line that is connected to a portion of the CVD reactor that moves. In particular, the other precursors may be provided to the central injector column through a lower portion of the CVD reactor that remains stationary when CVD reactor is opened by, for example, lifting the upper portion of the CVD reactor to open the CVD reactor chamber. Accordingly, when the CVD reactor chamber is in the open position, the upper and lower portions of the CVD reactor separate from one another to expose, for example, the planetary arrangements described herein.

As appreciated by the present inventors, providing the low vapor pressure MO precursor vapor to the central injector column by a different path than the other precursors, can allow the low vapor pressure MO precursor vapor to be heated to the relatively high temperature without adversely affecting (e.g., heating) the other precursors above room temperature, for example. Accordingly, while the other precursors may be provided via other precursor lines routed though the lower portion that are configured to mate/unmate when the CVD reactor is closed/opened, the heated low vapor pressure MO precursor line to the central injector column can remain a unitary flexible piece that allows the upper portion to move when opened/closed yet still be thermally isolated from the other precursors/precursor lines.

In some embodiments, the molar flow of the low vapor pressure MO precursor vapor is provided by a high temperature mass flow controller (MFC) that is downstream of the heated low vapor pressure MO precursor source vessel. In some embodiments according to the invention, an MFC is located upstream of the heated low vapor pressure MO precursor source vessel and a high temperature pressure controller is located downstream of the heated low vapor pressure MO precursor source vessel in-line with the line that conducts the low vapor pressure MO precursor vapor to the CVD reactor chamber. Accordingly, in embodiments where a device, such as the high temperature MFC or the high temperature pressure controller, is located in-line with the line that conducts the low vapor pressure MO precursor vapor to the CVD reactor chamber downstream of the heated low vapor pressure MO precursor source vessel, the respective device is configured to operate at relatively high temperatures, such as greater than 150 degrees Centigrade.

It will be understood that embodiments according to the invention can operate under the control of a processor circuit so that the heating and delivery of the low vapor MO precursor vapor is provided at the temperatures, pressures, amounts and other operational parameters needed to form single crystal piezoelectric layers as described herein.

Figure 7:
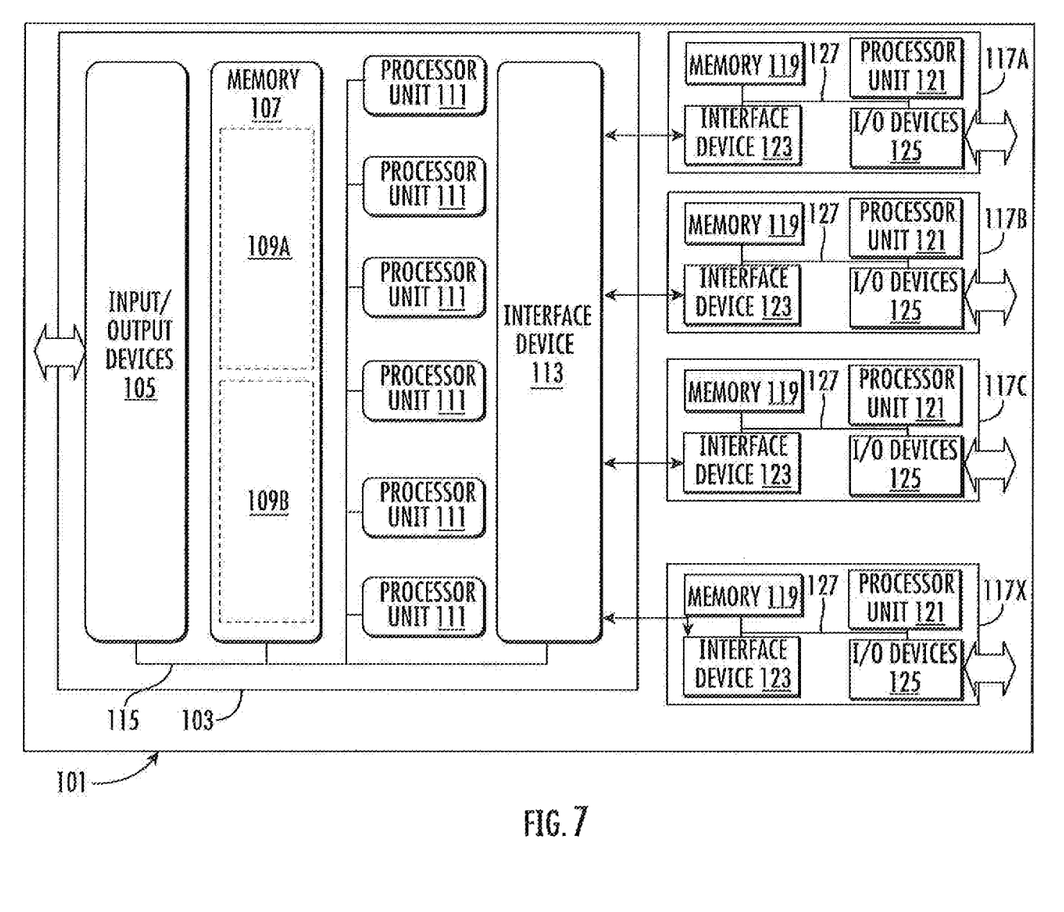
FIG. 7 illustrates an example of a computing system that may be used to implement embodiments according to the invention.
Figure 8:
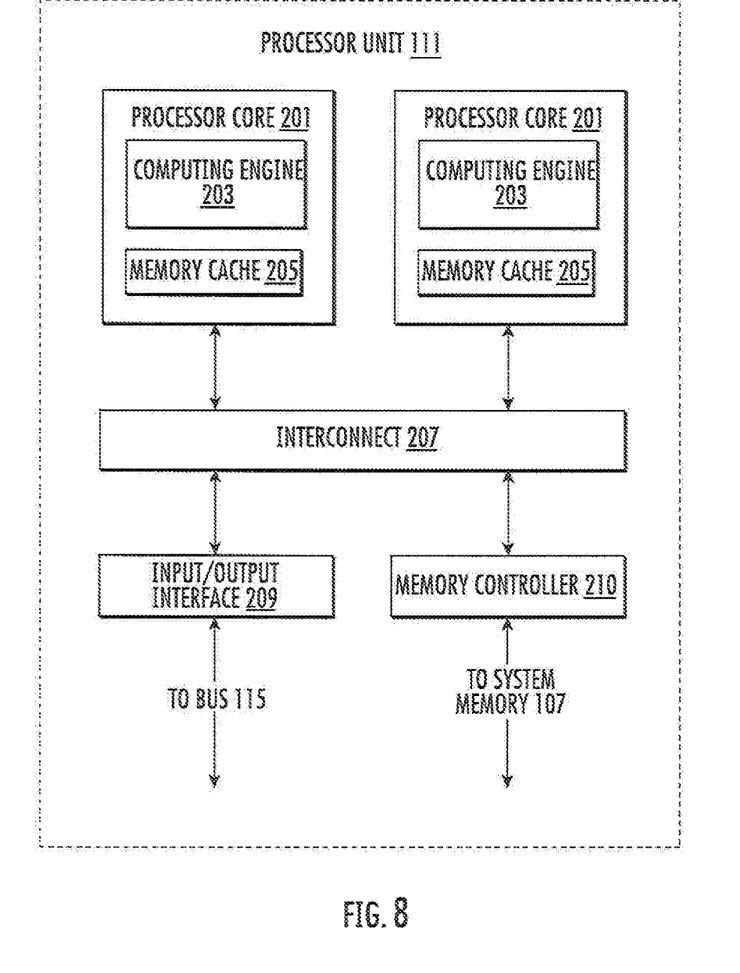
FIG. 8 illustrates an example of a multi-core processor unit that may be used to implement embodiments according to the invention.

Although the operations described herein may refer to the operations being carried out by a processor circuit it will be understood that in some embodiments separate operations (or separate portions of the same operation) may be carried out, entirely or partially by a plurality of processor circuits and/or processing systems that are operatively coupled together to carry of the methods of forming that are described herein, as shown for example in FIGS. 7 and 8.

Figure 1:
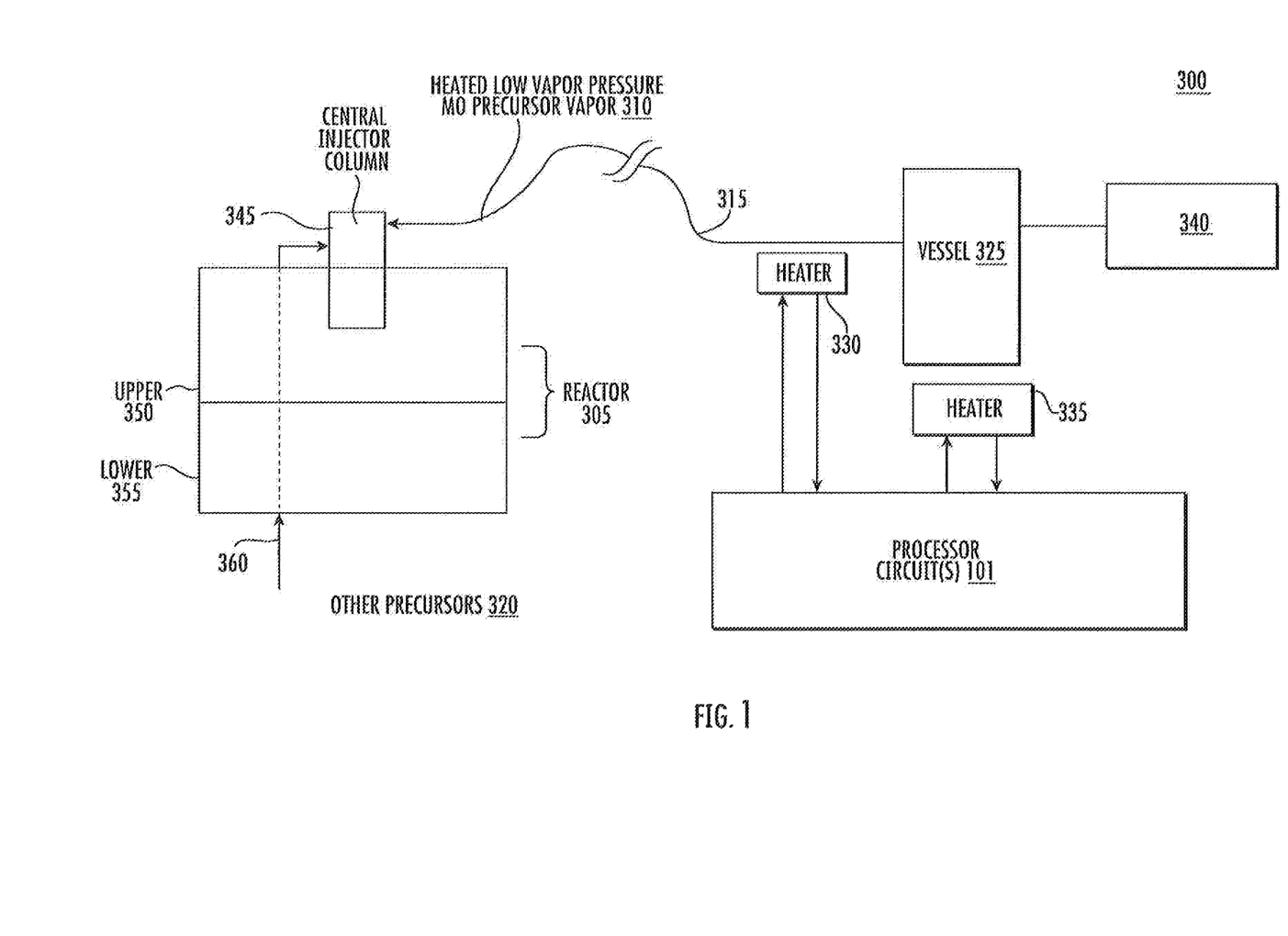
FIG. 1 is a schematic representation of a CVD system including a horizontal flow CVD reactor supplied with a heated low vapor pressure MO precursor vapor routed to the CVD reactor via a heated line that is thermally isolated from other precursors delivered to the CVD reactor in some embodiments according to the invention.

FIG. 1 is a schematic representation of a CVD system 300 including a horizontal flow CVD reactor 305 supplied with a heated low vapor pressure MO precursor vapor 310 routed to the CVD reactor 305 via a heated line 315 that is thermally isolated from other precursors 320 delivered to the CVD reactor 305 in some embodiments according to the invention. As shown in FIG. 1, the CVD reactor 305 includes an upper portion 350 and a lower portion 355 that are moveably coupled together. In operation, the upper portion 350 can separate from the lower portion 355 to expose a planetary wafer transport system so that wafers may be loaded into a plurality of wafer stations.

A central injector column 345 penetrates the upper portion 350 of the reactor 305 and is coupled to separate lines configure to carry different precursors. In particular, the central injector column 345 is coupled to a heated low vapor pressure MO precursor line 315 that carries a low vapor pressure MO precursor vapor 310. The heated low vapor pressure MO precursor line 315 is heated by a heater 330 that operates under the control of the processor circuit 101 to maintain the temperature of the line 315 so that the precursor vapor 310 is provided to the reactor chamber at a temperature in a range between about 120 degrees Centigrade to about 200 degrees Centigrade. In some embodiments, the processor circuit 101 controls the heated line 315 so that the precursor vapor 310 is provided to the reactor chamber at a temperature in a range between more than 150 degrees Centigrade to about 200 degrees Centigrade.

As further shown in FIG. 1, other precursors 320 can also be provided to the central injector column 345 via a path 360 that is separated from the line 315. In some embodiments, the other precursors can include other metal organic precursors as wells as hydrides. It will be understood that the path 360 and the line 315 are located to be thermally isolated from one another so that the heated precursor vapor 310 can be delivered to the central injector column 345 without substantially affecting the temperature of the other precursors 320. In other words, in some embodiments according to the invention, the heated line 315 is located so that the vapor 310 can be heated without substantially heating the other precursors 320.

As appreciated by the present inventors, in some conventional systems the low vapor pressure MO precursor vapor may be delivered to the injector in close proximity to other precursors. Therefore, if steps are not taken to thermally isolate a heated low vapor pressure metal organic precursor vapor from the other precursors delivered to the central injector column, the other precursors may be adversely effected which may cause the other precursors to react before being delivered to the reactor chamber. Accordingly, the heated line 315 can be thermally isolated form the other precursors by, for example, routing the respective lines to be spaced apart from one another. In some embodiments, the heated precursor line 315 is spaced apart from the lines 360 that carry the other precursors to avoid inadvertently heating the other precursors with the heated lines 315.

According to FIG. 1, the heated line 315 is connected to the central column injector 345 without passing through the lower portion 355, which may remain fixed when the upper portion 350 is raised to open the CVD reactor 305. Instead, in some embodiments the heated line 315 is a flexible line that is coupled to central injector column 345 on the upper portion 350. Accordingly, when the CVD reactor 305 is opened, the upper portion 350 is raised whereas the lower portion 355 remains fixed. The flexible heated line 315, however, allows the CVD reactor 305 to be opened while the flexible heated line 315 remains coupled to the central injector column 345. In contrast, the lines 360 which carry the other precursors 320 may be routed through both the lower portion 355 and the upper portion. Accordingly, the other lines 360 can include in-line joints that are configured to un-mate when the CVD reactor 305 is opened and to mate together again when the CVD reactor 305 is closed. The heat flexible line 315, however, remains a unitary structure when the CVD reactor 305 is opened or closed.

As further shown in FIG. 1, a heater 330 is thermally coupled to the heated line 315 and is controlled by the processor circuit 101 to maintain the temperature of the heated low vapor pressure metal organic precursor vapor 310 within the desired temperature range via a feedback loop, as shown. A heater 335 is also thermally coupled to a low vapor pressure precursor source vessel 325, which can hold the material which generates the low vapor pressure MO precursor vapor 310. The processor circuit 101 can also monitor the operation the heater 335 and adjust the temperature based on the feedback as described above. It will be understood that the heater 330 may include different segments that are each thermally coupled to the heated line 315, which can all be controlled by the processor circuit 101 as an integrated unit. It will be understood that the processor circuit can adjust the temperature of the low vapor pressure MO precursor vapor 310 to be greater than a target value to allow for heat loss during the transfer so that the vapor is delivered to the reactor chamber in the desired temperature range.

Figure 2:
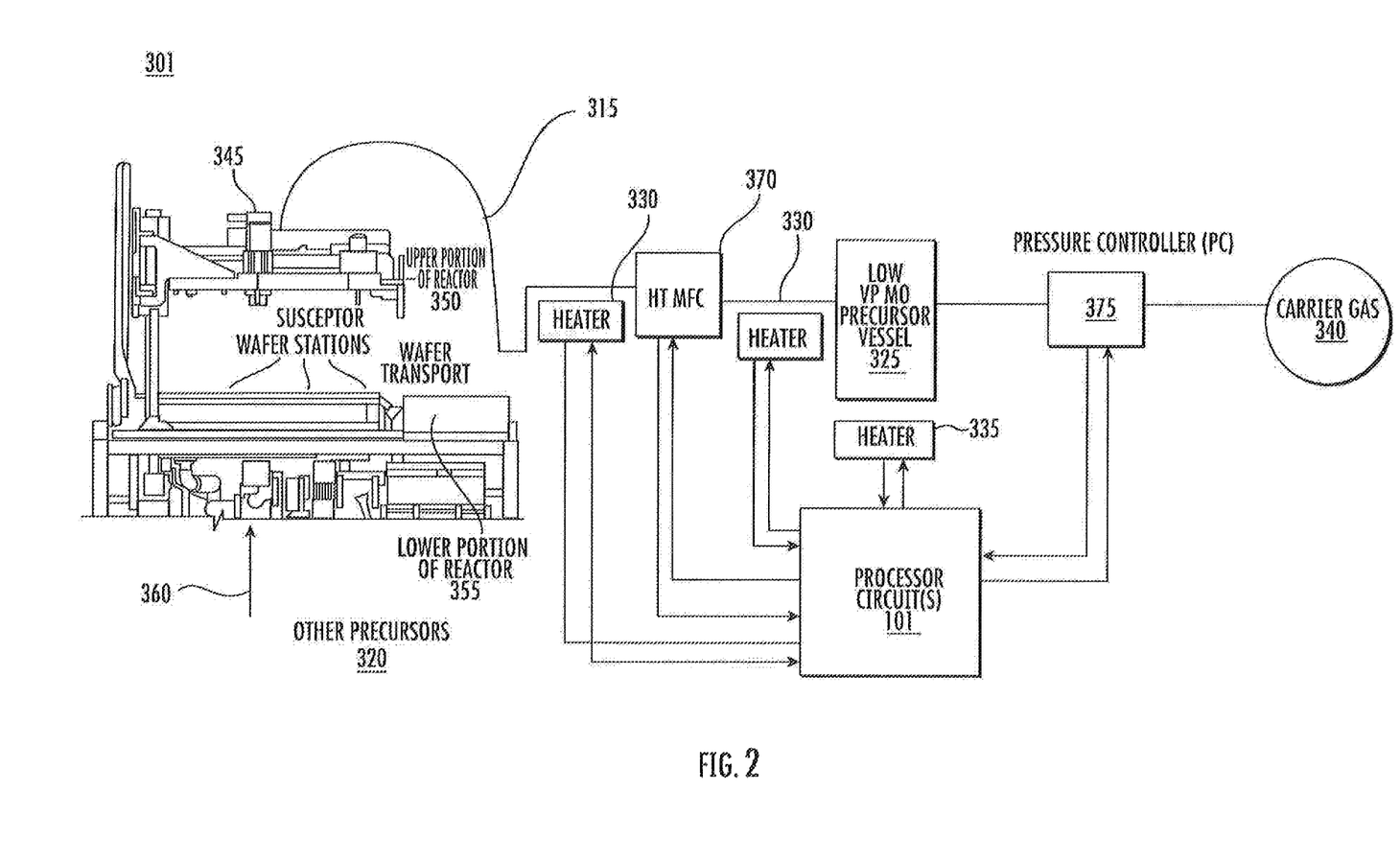
FIG. 2 is a schematic representation of a CVD system including a horizontal flow CVD reactor supplied with a heated low vapor pressure MO precursor vapor routed to the CVD reactor via a heated line that is thermally isolated from other precursors delivered to the CVD reactor in some embodiments according to the invention.

FIG. 2 is a schematic representation of a CVD system 301 including a horizontal flow CVD reactor 305 supplied with the heated low vapor pressure MO precursor vapor 310 routed to the CVD reactor 305 via the heated line 315 and an in-line high temperature mass flow controller 370, thermally isolated from other precursors 320 delivered to the CVD reactor 305 in some embodiments according to the invention. According to FIG. 2, the reactor 305 is shown in the open position such that the upper portion 350 is separated from the lower portion 355 to expose the wafer transport and the wafer stations. As further shown in FIG. 2, the heated line 315 remains connected to the central injector column 345 when the CVD reactor 305 is in the open position. Accordingly, the coupling between the low vapor pressure metal organic precursor source vessel 325 to the central injector column 245 remains intact even when the CVD reactor 305 is in the open position.

Still further, FIG. 2 shows a high temperature mass flow controller 370 in-line with the heated low vapor pressure metal organic precursor line 315 between the central injector column 345 and the vessel 325. The high temperature mass flow controller (MFC) 370 operates under control of the processor circuit 101 to detect and maintain the flow of the vapor 310 from the vessel 325 into the central injector column 345 during operation of the CVD reactor 305. The high temperature mass flow controller 370 is configured to operate at a temperature that is in the range in which the vapor 315 is heated. For example, in some embodiments processor circuit 101 controls the operation of the MFC 370 so that the desired molar amount of the low vapor pressure MO precursor vapor 310 is provided from the vessel 325 to the CVD reactor 305 at the desired temperature. The system 301 also includes a pressure controller 375 that operates under the control of the processor circuit 101 to provide a carrier gas from a carrier gas source 340 into the vessel 325.

Figure 3:
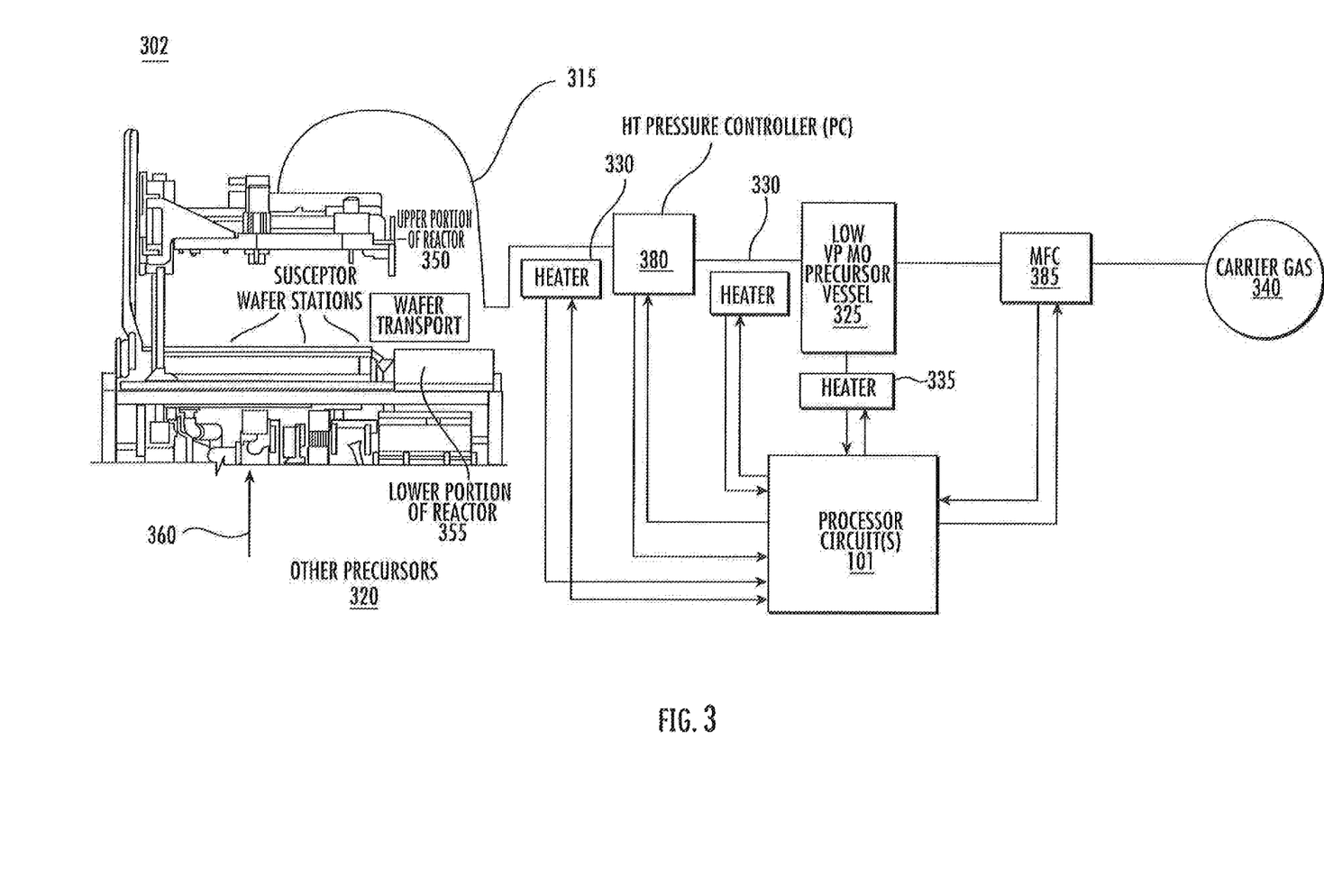
FIG. 3 is a schematic representation of a CVD system including a horizontal flow CVD reactor supplied with a heated low vapor pressure MO precursor vapor routed to the CVD reactor via a heated line that is thermally isolated from other precursors delivered to the CVD reactor in some embodiments according to the invention.

FIG. 3 is a schematic representation of a CVD system 302 including a horizontal flow CVD reactor 305 supplied with a heated low vapor pressure MO precursor vapor 310 routed to the CVD reactor 305 via a heated line that 315 and an in-line high temperature pressure controller 380, thermally isolated from other precursors 320 delivered to the CVD reactor 305 in some embodiments according to the invention. According to FIG. 3 the CVD reactor 305 is shown in the open position such that the upper portion 350 is separated from the lower portion 355 to expose the wafer transport and the wafer stations. As further shown in FIG. 2, the heated line 315 remains connected to the central injector column 345 when the CVD reactor 305 is in the open position. Accordingly, the coupling between the low vapor pressure metal organic precursor source vessel 325 to the central injector column 245 remains intact even when the CVD reactor 305 is in the open position.

Still further, FIG. 3 shows a high temperature pressure controller 380 in-line with the heated low vapor pressure metal organic precursor line 315 between the central injector column 345 and the vessel 325. The high temperature pressure controller 380 operates under control of the processor circuit 101 to detect and maintain the pressure of the vapor 310 from the vessel 325 into the central injector column 345 during operation of the CVD reactor 305 at the desired temperature. The high temperature pressure controller 380 is configured to operate at a temperature that is in the range in which the vapor 315 is heated. For example, in some embodiments the processor circuit 101 controls the operation of the high temperature pressure controller 380 so that the desired molar amount of the low vapor pressure MO precursor vapor 310 is provided from the vessel 325 to the CVD reactor 305 at the desired temperature and pressure. The system 302 also includes a mass flow converter 385 that operates under the control of the processor circuit 101 to provide the proper amount of the carrier gas from the carrier gas source 340 into the vessel 325.

Figure 4:
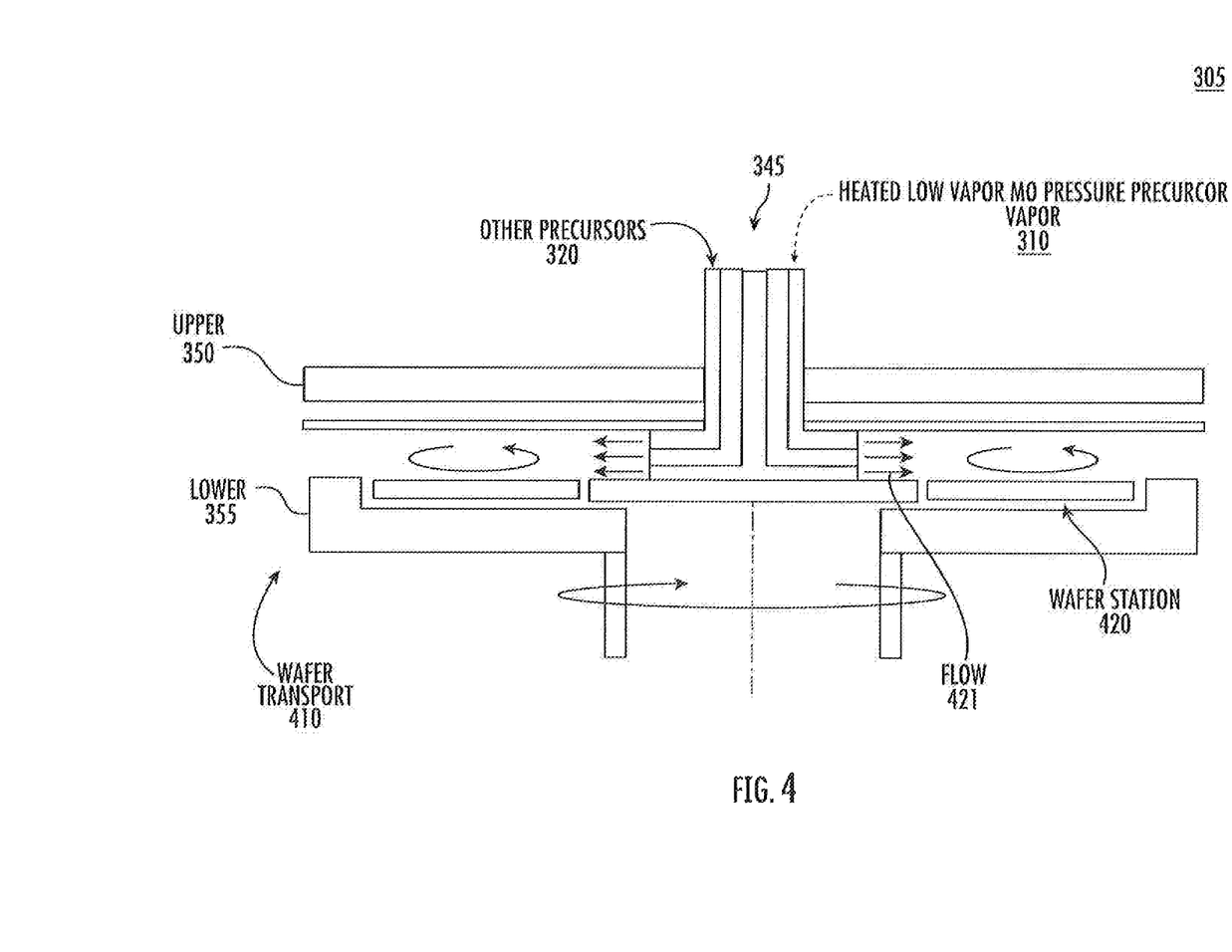
FIG. 4 is a schematic representation of a planetary wafer transport that rotates in the horizontal flow CVD reactor during laminar flow of the low vapor pressure MO precursor vapor over the wafers and a plurality of wafer stations thereon that rotate on the planetary wafer transport in some embodiments according to the invention.

FIG. 4 is a schematic representation of a planetary wafer transport 410 that rotates in the horizontal flow CVD reactor 305 during laminar flow 421 of the low vapor pressure MO precursor vapor 310 over the wafers and a plurality of wafer stations 420 thereon that rotate on the planetary wafer transport in some embodiments according to the invention. As shown in FIG. 4, the CVD reactor 305 includes a planetary wafer transport 410 on the lower portion 355 of the reactor, which rotates in a first direction. The planetary wafer transport 410 includes a plurality of wafer stations 420, each of which can hold a wafer on which the single crystal piezoelectric layers can be formed in some embodiments according to the invention. Each of the plurality of wafer stations 420 can rotate in a second direction that is opposite to the first direction.

The central injector column 345 penetrates the upper portion 350 to provide a laminar flow of precursor across the surface of the wafers as the planetary wafer transport 410 and the wafer stations 420 rotate in their respective directions. The laminar flow is horizontal across the surfaces of the wafers as shown. In some embodiments according to the invention, the heated low vapor pressure MO precursor vapor 310 can be introduced to the central injector column 345 so as to not to react with the non-heated MO precursors or the hydrides before reaching the reactor chamber. In some embodiments according to the invention, the conduits for the heated low vapor pressure MO precursor vapor 310 and the non-heated MO precursors and the hydrides are spaced apart from one another in the central injector column 345 so to be thermally insulated from one another.

Figure 5:
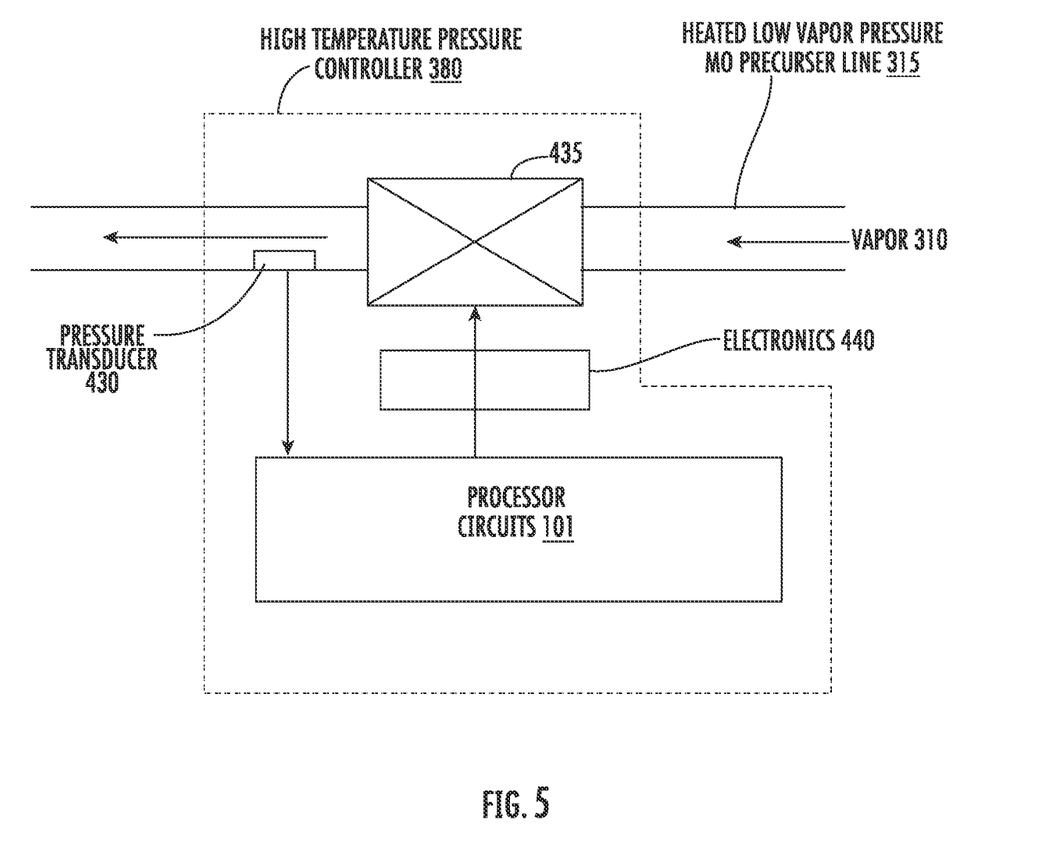
FIG. 5 is a schematic illustration of a high temperature pressure controller in-line with the heated low vapor pressure MO precursor line downstream from the heated low vapor pressure MO precursor source vessel in some embodiments according to the invention.

FIG. 5 is a schematic illustration of the high temperature pressure controller 380 in-line with the heated low vapor pressure MO precursor line 315 downstream from the heated low vapor pressure MO precursor source vessel 325 in some embodiments according to the invention. As shown in FIG. 5, the high temperature pressure controller 380 can include a pressure valve 435 in line with the heated low vapor pressure MO precursor line 315 and a pressure transducer 430, both of which can operate in the temperature range to which the vapor 310 is to be heated, such as more than 150 degrees Centigrade to about 200 degrees Centigrade. Further, the high temperature pressure controller 380 can include local electronics 440 operatively couple to the pressure value 435 and configured to adjust the pressure valve 435 so as to change the pressure in the heated line 315. It will also be understood that the high temperature pressure controller 380 can include the processor circuit 101, which can be configured to carry out the operations described herein in some embodiments.

Figure 6:
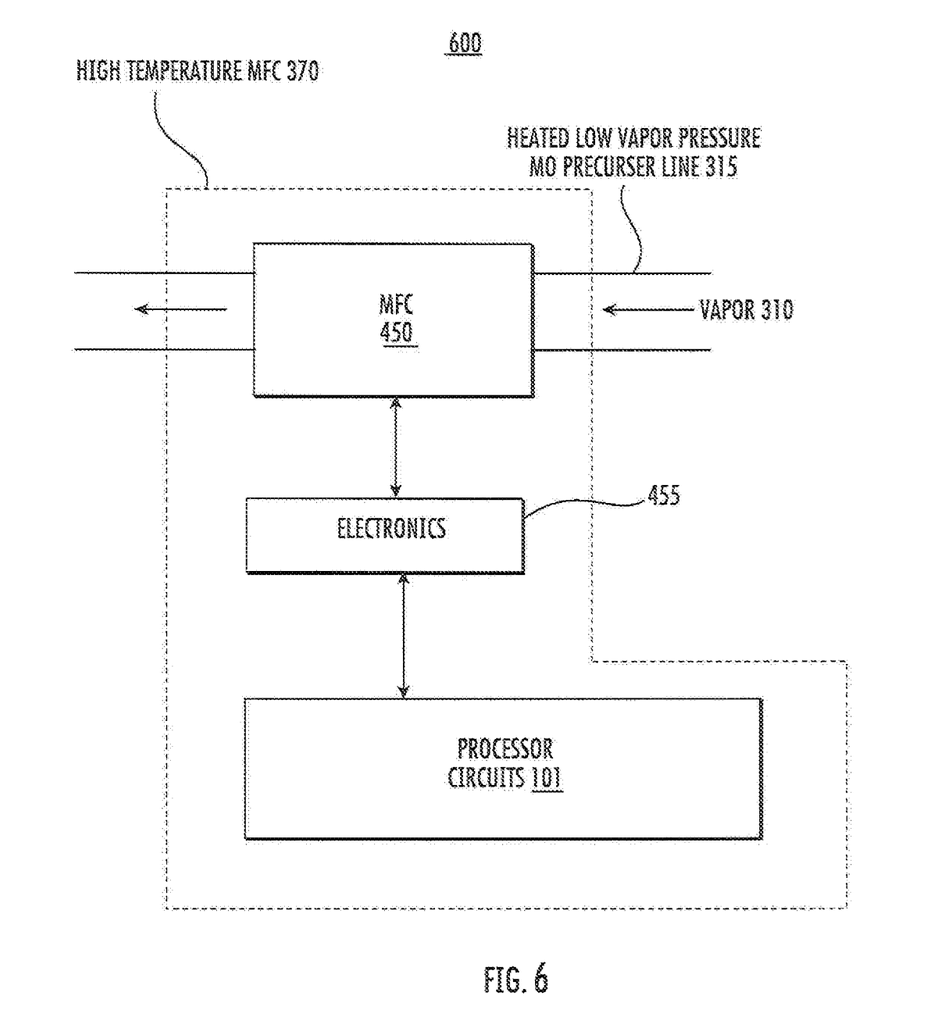
FIG. 6 is a schematic illustration of a high temperature mass flow controller in-line with the heated low vapor pressure MO precursor line downstream from the heated low vapor pressure MO precursor source vessel in some embodiments according to the invention.

FIG. 6 is a schematic illustration of a high temperature mass flow controller 370 in-line with the heated low vapor pressure MO precursor line 315 downstream from the heated low vapor pressure MO precursor source vessel 325 in some embodiments according to the invention. As shown in FIG. 6, the high mass flow controller (MFC) 370 can include a an MFC 435 in line with the heated low vapor pressure MO precursor line 315 which can operate in the temperature range to which the vapor 310 is to be heated, such as more than 150 degrees Centigrade to about 200 degrees Centigrade. Further, the high temperature MFC 370 can include local electronics 455 operatively couple to the high temperature MFC 450 and configured to adjust the molar amount of the vapor 310 in the heated line 315. It will also be understood that the high temperature MFC 370 can include the processor circuit 101, which can be configured to carry out the operations described herein in some embodiments.

The execution of various embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of real-time nature of the methods and operations of the apparatus of embodiment according to the invention, as described herein, the processor circuit(s) or computing system described herein may be capable of concurrently running multiple processing threads.

FIG. 7 illustrates an example of a computing system that may be used to implement embodiments according to the invention including the components and operation of a processor circuit 101 having a host or master computer and one or more remote or servant computers. This operating environment is only one example of a suitable operating environment, however, and is not intended to suggest any limitation as to the scope of use or functionality of the disclosed technology.

In FIG. 7, the processor circuit 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing the operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel. Pentium. or Xeon microprocessors, Advanced Micro Devices Athlon™ microprocessors or Motorola 68K/Coldfire. microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

With some implementations of the disclosed technology, the master computing device 103 may employ one or more processing units 111 having more than one processor core. FIG. 8 illustrates an example of a multi-core processor unit 111 that may be employed with various embodiments of the disclosed technology. As shown in FIG. 8, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 8 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 7, the interface device 113 allows the master computer 103 to communicate with the servant computers 117A, 117B, 117C ... 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the processor circuit 101 illustrated in FIG. 7 and FIG. 8 is provided as an example only, and it not intended to suggest any limitation as to the scope of use or functionality of alternate embodiments of the disclosed technology.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a method, data processing system, and/or computer program product. Furthermore, embodiments may take the form of a computer program product on a tangible computer readable storage medium having computer program code embodied in the medium that can be executed by a computer.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wired, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages, such as a programming language for a FPGA, Verilog, System Verilog, Hardware Description language (HDL), and VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

Some embodiments are described herein with reference to flowchart illustrations and/or block diagrams of methods, systems and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

What is claimed is:

1. An apparatus for forming films on wafers, the apparatus comprising:
a horizontal flow reactor including an upper portion and a lower portion that are moveably coupled to one another so as to separate from one another in an open position and so as to mate together in a closed position to form a reactor chamber;
a central injector column that penetrates through the upper portion of the horizontal flow reactor into the reactor chamber, the central injector column configured to allow a low vapor pressure metalorganic precursor vapor into the reactor chamber in the closed position and configured to allow a hydride precursor vapor and/or allow a non-low vapor pressure metalorganic precursor vapor into the reactor chamber in the closed position;
wherein the central injector column further comprises separate conduits for each of the low vapor pressure metalorganic precursor vapor and for the hydride precursor vapor and/or for the non-low vapor pressure metalorganic precursor vapor routed through central injector column to the reactor chamber
a hydride precursor line and/or a non-low vapor pressure metalorganic precursor line routed through the lower portion of the horizontal flow reactor and through the upper portion of the horizontal flow reactor to couple to the separate conduits of the central injector column;
a heated metalorganic precursor line coupled to the central injector column and configured to heat the low vapor pressure metalorganic precursor vapor contained in the heated metalorganic precursor line upstream of the central injector column to a temperature range between about 70 degrees Centigrade and 200 degrees Centigrade wherein the heated metalorganic precursor line is coupled to one of the separate conduits for the low vapor pressure metalorganic precursor vapor in the central injector column without passing through the lower portion of the horizontal flow reactor.

2. The apparatus of claim 1 further comprising:
a planetary wafer transport coupled to the lower portion of the horizontal flow reactor, the planetary wafer transport, wherein the planetary wafer transport rotates inside the reactor chamber; and
a plurality of wafer stations on the planetary wafer transport, each of the plurality of wafer stations configured to receive a respective wafer for formation of the semiconductor films thereon, wherein each of the plurality of wafer stations rotates relative to the planetary wafer transport.

3. The apparatus of claim 2 further comprising:
a susceptor inside the reactor chamber and configured to rotate inside the reactor chamber to generate a horizontal laminar flow of the low vapor pressure metalorganic precursor vapor received via central injector column.

4. The apparatus of claim 1 wherein the heated metalorganic precursor line is configured to heat the low vapor pressure metalorganic precursor vapor to the temperature range between 100 degrees Centigrade and 120 degrees Centigrade.

5. The apparatus of claim 1 wherein the heated metalorganic precursor line is configured to heat the low vapor pressure metalorganic precursor vapor to the temperature range between 120 degrees Centigrade and 150 degrees Centigrade.

6. The apparatus of claim 1 wherein the heated metalorganic precursor line remains a unitary structure when the horizontal flow reactor is in the open position.

7. The apparatus of claim 1 wherein the heated metalorganic precursor line remains a unitary structure from a run/vent valve to an inlet in the central injector column when the horizontal flow reactor is in the open position.

8. The apparatus of claim 1 wherein the heated metalorganic precursor line comprises a flexible line.

9. The apparatus of claim 1 further comprising:
a heated metalorganic precursor source vessel coupled to the central injector column by the heated metalorganic precursor line, the heated metalorganic precursor source vessel configured to heat the low vapor pressure metalorganic precursor vapor to the temperature range between 70 degrees Centigrade to 180 degrees Centigrade.

10. The apparatus of claim 9 further comprising:
a mass flow controller between the heated metalorganic precursor source vessel and a carrier gas source, the mass flow controller configured to control an amount of a carrier gas provided to the heated metalorganic precursor source vessel; and
a pressure controller in-line with the heated metalorganic precursor line between the heated metalorganic precursor source vessel and the central injector column, the pressure controller configured to regulate a pressure of the low vapor pressure metalorganic precursor vapor in the heated metalorganic precursor line to between 200 mbar and 1500 mbar in the temperature range.

11. The apparatus of claim 1 wherein the heated metalorganic precursor line comprises:
a metalorganic precursor line configured to conduct the low vapor pressure metalorganic precursor vapor to the central injector column at a selected temperature in the temperature range; and
a heater thermally coupled to the metalorganic precursor line configured to maintain the low vapor pressure metalorganic precursor vapor in the metalorganic precursor line at the selected temperature.

12. The apparatus of claim 9 further comprising:
a pressure controller between the heated metalorganic precursor source vessel and a carrier gas source, the pressure controller configured to regulate a pressure at which a carrier gas is provided to the heated metalorganic precursor source vessel; and
a mass flow controller in-line with the heated metalorganic precursor line between the heated metalorganic precursor source vessel and the central injector column, the mass flow controller configured to control an amount of the low vapor pressure metalorganic precursor vapor in the heated metalorganic precursor line to between 1 sccm and 10 slpm in the temperature range.

13. An apparatus for forming films on wafers, the apparatus comprising:
a horizontal flow reactor including an upper portion and a lower portion that are moveably coupled to one another so as to separate from one another in an open position and so as to mate together in a closed position to form a reactor chamber;

a central injector column that penetrates through the upper portion of the horizontal flow reactor into the reactor chamber, the central injector column configured to allow a low vapor pressure metalorganic precursor vapor into the reactor chamber in the closed position and the central injector column is configured to allow a hydride precursor vapor and/or allow a non-low vapor pressure metalorganic precursor vapor into the reactor chamber in the closed position;

wherein the central injector column further comprises separate conduits for each of the low vapor pressure metalorganic precursor vapor, and for the hydride precursor vapor and/or for the non-low vapor pressure metalorganic precursor vapor routed through central injector column to the reactor chamber;

a hydride precursor line and/or a non-low vapor pressure metalorganic precursor line routed through the lower portion of the horizontal flow reactor and through the upper portion of the horizontal flow reactor to couple to the separate conduits of the central injector column;

an actively heated metalorganic precursor line coupled to the central injector column wherein the actively heated metalorganic precursor line is a coupled to one of the separate conduits for the low vapor pressure metalorganic precursor vapor in the central injector column without passing through the lower portion of the horizontal flow reactor;

a heated metalorganic precursor source vessel coupled to the central injector column by the actively heated metalorganic precursor line;

a mass flow controller between the heated metalorganic precursor source vessel and a carrier gas source;

a pressure controller in-line with the actively heated metalorganic precursor line between the heated metalorganic precursor source vessel and the central injector column.

14. The apparatus of claim 13 wherein the actively heated metalorganic precursor line is remains a unitary structure when the horizontal flow reactor is in the open position.

15. The apparatus of claim 13 wherein the actively heated metalorganic precursor line remains a unitary structure from a run/vent valve to an inlet in the central injector column when the horizontal flow reactor is in the open position.

16. The apparatus of claim 13 wherein the actively heated metalorganic precursor line includes at least one bellows expansion joint.

* * * * *

UNITED STATES PATENT AND TRADEMARK OFFICE
CERTIFICATE OF CORRECTION

| | |
|---|---|
| PATENT NO. | : 11,618,968 B2 |
| APPLICATION NO. | : 16/784843 |
| DATED | : April 4, 2023 |
| INVENTOR(S) | : Moe et al. |

It is certified that error appears in the above-identified patent and that said Letters Patent is hereby corrected as shown below:

On the Title Page (56) References, Other Publications, p. 3: Please correct "transistor&oldid-876524143" to read -- transistor&oldid=876524143 --

In the Claims

Column 13, Claim 1, Line 45: Please correct "between about 70 degrees" to read -- between 70 degrees --

Signed and Sealed this
Fourth Day of July, 2023

Katherine Kelly Vidal
*Director of the United States Patent and Trademark Office*